United States Patent
Rao

(10) Patent No.: US 7,995,409 B2
(45) Date of Patent: Aug. 9, 2011

(54) MEMORY WITH INDEPENDENT ACCESS AND PRECHARGE

(75) Inventor: G. R. Mohan Rao, McKinney, TX (US)

(73) Assignee: S. Aqua Semiconductor, LLC, Wilmington, DE (US)

( * ) Notice: Subject to any disclaimer, the term of this patent is extended or adjusted under 35 U.S.C. 154(b) by 125 days.

(21) Appl. No.: 11/873,283

(22) Filed: Oct. 16, 2007

(65) Prior Publication Data

US 2009/0097346 A1    Apr. 16, 2009

(51) Int. Cl.
   *G11C 7/00* (2006.01)
(52) U.S. Cl. .......... 365/203; 365/189.04; 365/149; 365/230.03
(58) Field of Classification Search .......... 365/203, 365/233, 230.03, 189.02, 230.02
   See application file for complete search history.

(56) References Cited

U.S. PATENT DOCUMENTS

| | | | |
|---|---|---|---|
| 4,208,730 A * | 6/1980 | Dingwall et al. | 365/181 |
| 4,335,459 A | 6/1982 | Miller | |
| 4,685,089 A | 8/1987 | Patel et al. | |
| 5,214,610 A * | 5/1993 | Houston | 365/233.5 |
| 5,233,560 A | 8/1993 | Foss et al. | |
| 5,381,363 A | 1/1995 | Bazes | |
| 5,416,746 A | 5/1995 | Sato et al. | |
| 5,598,374 A * | 1/1997 | Rao | 365/230.03 |
| 5,636,174 A | 6/1997 | Rao | |
| 5,657,285 A | 8/1997 | Rao | |
| 5,686,730 A * | 11/1997 | Laudon et al. | 365/52 |
| 5,745,428 A * | 4/1998 | Rao | 365/230.03 |
| 5,802,395 A * | 9/1998 | Connolly et al. | 710/14 |
| 5,825,710 A * | 10/1998 | Jeng et al. | 365/230.03 |
| 5,828,610 A | 10/1998 | Rogers et al. | |
| 5,835,932 A | 11/1998 | Rao | |
| 5,856,940 A | 1/1999 | Rao | |
| 5,880,990 A | 3/1999 | Miura | |
| 5,995,438 A | 11/1999 | Jeng et al. | |
| 6,101,579 A | 8/2000 | Randolph et al. | |
| 6,256,221 B1 | 7/2001 | Holland et al. | |
| 6,512,715 B2 | 1/2003 | Okamoto et al. | |
| 6,529,412 B1 | 3/2003 | Chen et al. | |
| 6,621,758 B2 | 9/2003 | Cheung et al. | |
| 6,779,076 B1 | 8/2004 | Shirley | |
| 6,959,272 B2 | 10/2005 | Wohl et al. | |
| 7,124,348 B2 | 10/2006 | Nicolaidis | |
| 7,139,213 B2 | 11/2006 | Rao | |
| 7,207,024 B2 * | 4/2007 | Scheffer | 716/11 |
| 7,254,690 B2 | 8/2007 | Rao | |
| 7,724,593 B2 | 5/2010 | Rao | |

(Continued)

OTHER PUBLICATIONS

Micron; 512Mb: ×4, ×8, ×16 DDR2 SDRAM Features; pp. 1-133; Micron Technologies, Inc.; 2004.

(Continued)

*Primary Examiner* — Pho M Luu
*Assistant Examiner* — Tha-O Bui
(74) *Attorney, Agent, or Firm* — Schwabe, Williamson & Wyatt, PC

(57) ABSTRACT

Digital memory devices and systems, as well as methods of operating digital memory devices, that include access circuitry to access a first subset of a plurality of memory cells associated with a current access address during a current access cycle and precharge circuitry, disposed in parallel relative to the access circuitry, to precharge in full or in part a second subset of the plurality of memory cells associated with a next precharge address during the current access cycle.

20 Claims, 3 Drawing Sheets

U.S. PATENT DOCUMENTS

| | | | |
|---|---|---|---|
| 7,755,961 | B2 | 7/2010 | Rao |
| 2001/0015933 | A1 | 8/2001 | Reddy et al. |
| 2002/0174292 | A1* | 11/2002 | Morita et al. ............. 711/105 |
| 2003/0008446 | A1 | 1/2003 | Osada et al. |
| 2005/0007847 | A1 | 1/2005 | Bell et al. |
| 2005/0207201 | A1 | 9/2005 | Madan et al. |
| 2006/0067129 | A1 | 3/2006 | La Rosa et al. |
| 2007/0028060 | A1 | 2/2007 | Ware et al. |
| 2008/0123450 | A1 | 5/2008 | Rao |
| 2008/0123451 | A1* | 5/2008 | Rao ............................. 365/203 |
| 2010/0202230 | A1 | 8/2010 | Rao |

OTHER PUBLICATIONS

JEDEC; Double Data Rate (DDR) SDRAM Specification; pp. 1-85; JEDEC Solid State Technology Association 2005.

International Search Report and Written Opinion mailed Dec. 19, 2008 for PCT/US08/079423.

Ma, Chiyuan et al., "A DRAM Precharge Policy Based on Address Analysis," 10th Euromicro Conference on Digital System Design Architectures, Methods and Tools (DSD 2007), IEEE, Aug. 31, 2007, 5 pgs.

Office Action mailed Sep. 16, 2009 for U.S. Appl. No. 11/771,895.

Supplemental Search Report mailed Aug. 12, 2009 for European Patent Application No. EP07812687.

Supplemental Search Report mailed Aug. 12, 2009 for European Patent Application No. EP07799372.

Examination Report mailed Aug. 21, 2009 for European Patent Application No. EP07812687.

Examination Report mailed Aug. 21, 2009 for European Patent Application No. EP07799372.

International Preliminary Report on Patentability mailed Jan. 22, 2009 for PCT/US2007/072974.

International Preliminary Report on Patentability mailed Jan. 22, 2009 for PCT/US2007/072981.

Office Action mailed Sep. 24, 2008 for U.S. Appl. No. 11/771,853.

Office Action mailed Jan. 13, 2009 for U.S. Appl. No. 11/771,853.

Office Action mailed Jun. 17, 2008 for U.S. Appl. No. 11/771,895.

Office Action mailed Oct. 30, 2008 for U.S. Appl. No. 11/771,895.

Notice of Allowance mailed Aug. 19, 2009 for U.S. Appl. No. 11/771,853.

International Search Report and Written Opinion mailed Jan. 22, 2009 for PCT/US2007/072974.

International Search Report and Written Opinion mailed Jan. 22, 2009 for PCT/US2007/072981.

Notice of Allowance, issued in U.S. Appl. No. 11/771,853, mailed Jan. 8, 2010.

International Preliminary Report on Patentability, issued in PCT Application No. PCT/US2008/079423, mailed Apr. 29, 2010.

Office Action, issued in U.S. Appl. No. 11/875,636, mailed Dec. 8, 2010, 7 pages.

Office Action, issued in U.S. Appl. No. 11/875,636, mailed Mar. 18, 2010, 7 pages.

Office Action, issued in U.S. Appl. No. 11/875,636, mailed Aug. 30, 2010, 8 pages.

International Search Report and Written Opinion, issued in International Patent Application No. PCT/US2008/080530, mailed Jan. 23, 2009, 10 pages.

International Preliminary Report on Patentability, issued in International Patent Application No. PCT/US2008/080530, mailed Apr. 29, 2010, 8 pages.

Office Action, issued in Korean Patent Application No. 10-2009-7002538, mailed Oct. 27, 2010, 2 pages.

Office Action, issued in Korean Patent Application No. 10-2009-7002540, mailed Oct. 27, 2010, 3 pages.

Notice of Allowance, issued in U.S. Appl. No. 12/767,517, mailed Feb. 25, 2011, 11 pages.

Notice of Allowance issued in Korean Patent Application No. 10-2009-7002538, mailed Mar. 2, 2011, 3 pages.

Office Action, issued in U.S. Appl. No. 11/875,636, mailed May 24, 2011, 7 pages.

\* cited by examiner

MEMORY WITH INDEPENDENT ACCESS AND PRECHARGE

FIELD OF THE DISCLOSURE

Embodiments of the disclosure relate to electronic circuits, in particular to digital memory banks with independent access and precharge circuitry.

BACKGROUND OF THE DISCLOSURE

For well over three decades, semiconductor memories—such as, for example, DRAM'S, SRAM'S, ROM'S, EPROM'S, EEPROM'S, Flash EEPROM'S, Ferroelectric RAM'S, MAGRAM'S and others—have played a vital role in many electronic systems. Their functions for data storage, code (instruction) storage, and data retrieval/access (Read/Write) continue to span a wide variety of applications. Usage of these memories in both stand alone/discrete memory product forms, as well as embedded forms such as, for example, memory integrated with other functions like logic, in a module or monolithic integrated circuit, continues to grow. Cost, operating power, bandwidth, latency, ease of use, the ability to support broad applications (balanced vs. imbalanced accesses), and nonvolatility are all desirable attributes in a wide range of applications.

Before performing an access operation on a subset of memory cells in a dynamic random access memory (DRAM) device, the bit lines must be precharged. A precharge operation on all memory banks typically occurs at the end of each access operation (READ or WRITE) so that the banks are ready for the next access operation. Precharging all memory banks cycle consumes substantial power over time. Also, in traditional DRAM designs, access and precharge circuitry share common circuitry and connection paths to memory banks. Also, both operations are dependent on a single clock. Therefore, precharge and access operations are carried out sequentially, causing delay between access operations.

DETAILED DESCRIPTION

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

The term "access cycle" is used throughout the specification and claims and refers to the time during which an access operation is performed on a memory device. Such an access operation may be a READ, WRITE, or other access operation. An access cycle as such does not necessarily refer to a single "clock cycle" of the device, but may in fact occur over the course of multiple clock cycles such as, for example, seven to nine clock cycles or some other number of clock cycles.

Embodiments of the present invention may include digital memory devices configured to access a first subset of memory cells of a digital memory device, such as a dynamic random access memory (DRAM) device, while independently and/or simultaneously precharging a second subset of memory cells of the same digital memory device during a current access cycle of the device. In embodiments, the digital memory device may receive an access command and an associated address specifying the first subset and also receive a precharge command and an associated next precharge address specifying the second subset. In embodiments, the next precharge address may be based on past accesses. In embodiments, the next precharge address may be based on spatial or temporal prefetches as taught by U.S. Pat. No. 5,835,932 "METHODS AND SYSTEMS FOR MAINTAINING DATA LOCALITY IN A MULTIPLE MEMORY BANK SYSTEM HAVING DRAM WITH INTEGRAL SRAM" issued Nov. 10, 1998. In particular, by storing spatially and/or temporally adjacent data within multiple banks, the probability may be increased that sequentially requested data may be found in adjacent banks and thus retrieval of that data may be able to take advantage of the independent precharge and access circuits. For further details, see the patent document.

Figure 1:
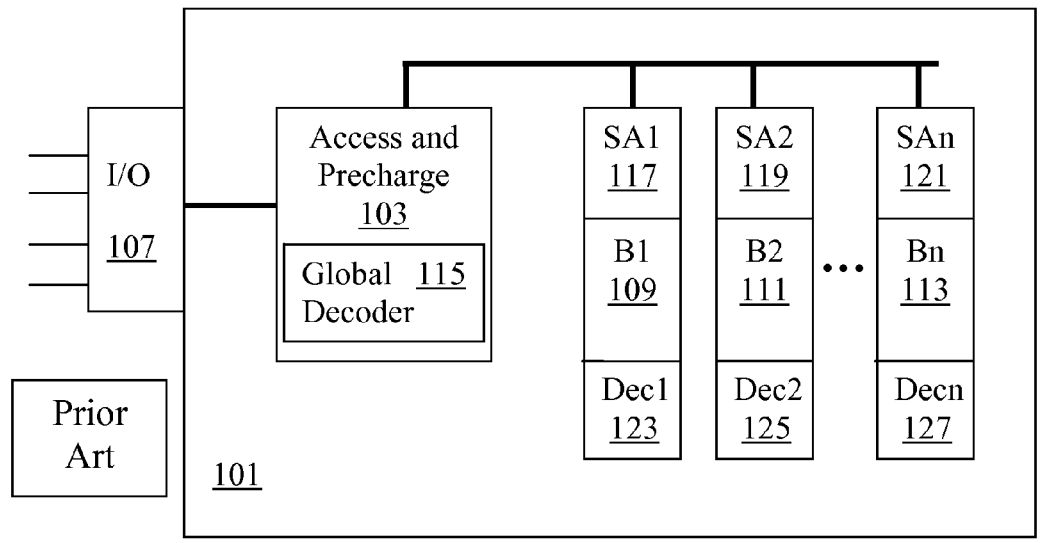
FIG. 1 illustrates a functional block diagram of a prior art digital memory device.

FIG. 1 illustrates a functional block diagram of a prior art digital memory device 101. Digital memory device 101 is depicted as a stand-alone integrated circuit, but one of ordinary skill in the art will recognize that other types of digital memory such as, for example, embedded memory or cache memory, operate in a same or similar fashion. Device 101 contains common access and precharge circuitry 103 sharing a single set of connections to n number of memory banks depicted as bank 109, bank 111, and bank 113. One of ordinary skill in the art will recognize that prior art digital memory devices may have any number of digital memory banks but typically contain an even number of banks. Memory banks 109, 111, and 113 each contain a plurality of dynamic random access memory (DRAM) cells arranged in arrays of N rows and M columns. As is known to those skilled in the art, such arrays are often partitioned into multiple subarrays. Memory banks 109, 111, and 113 are also shown with Sense Amplifier circuits 117, 119, and 121, respectively, which drive and sense voltages stored in the memory cells of the arrays of memory banks 109, 111, and 113 during a READ operation as well as writing new data values into the memory cells during a WRITE operation. Also included in memory banks 109, 111, and 113 are address decoders 123, 125, and 127. Access and precharge circuitry 103 is shown with global decoder 115. As one of ordinary skill in the art will appreciate, global decoder 115 and bank-specific decoders 123, 125, and 127 operate in conjunction to decode addresses received on pins of I/O (input/output) 107. Global decoder 115 typically decodes the most significant bits (MSB) of a received row or column address, directs the remainder of the received address to the appropriate bank where bank-specific decoders 123, 125, and 127 decode the least significant bits (LSB) in order to activate the particular subset of memory cells within the memory bank corresponding to the received address. In some prior art implementations, there may be no global decoder while in others, there may be no bank-specific decoders. Embodiments of the present invention described below are compatible with all such prior art architectures. In addition to being configured to receive a READ or WRITE command, digital memory device 101 is also configured to receive a PRECHARGE command to precharge the memory banks. As one of ordinary skill will appreciate, upon receiving a READ or WRITE command, digital memory device 101 will precharge the memory banks even without receiving a PRECHARGE command.

Typical operation of memory device 101 will now be briefly described. When an access command is received on pins of I/O 107 (such as, for example, a READ or WRITE), an address associated with the subset is also received on pins of I/O 107. This received address is at least partially, in some prior art implementations, decoded by global decoder 115 before access and precharge circuitry 103 passes the received command and/or address to the appropriate one of bank 109, 111, or 113 where the remainder of the received address is decoded by one of bank-specific decoders 123, 125, or 127 and the appropriate memory cells are then accessed by activating a row line and turning on sense amplifiers 117, 119, or 121. Access and Precharge circuitry 103 will also precharge memory banks 109, 111, and 113 either alone or in conjunction with bank-specific precharge circuitry. Because access and precharge circuitry 103 share circuits in common, different banks can not be simultaneously accessed and precharged during a current access cycle.

Figure 2:
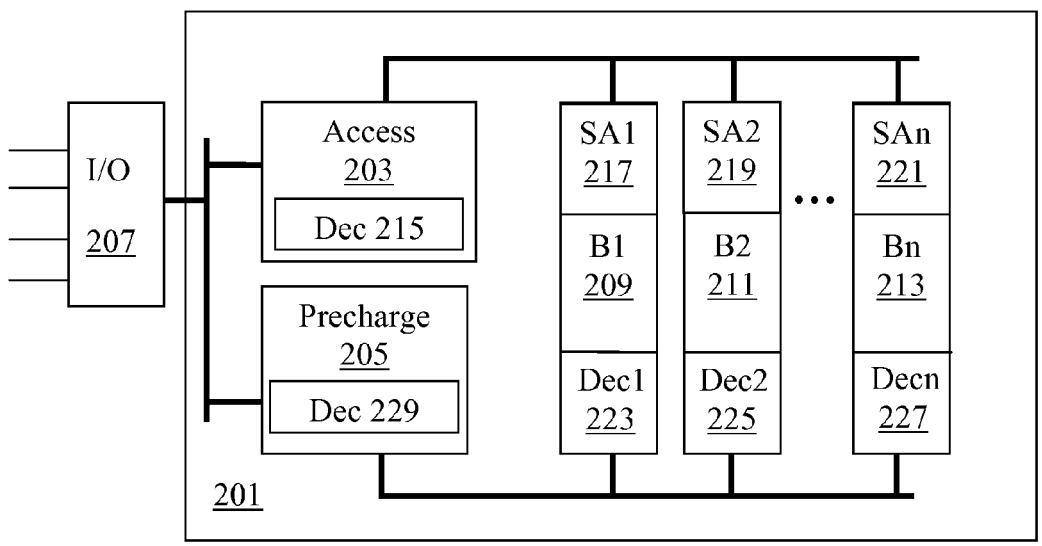
FIG. 2 illustrates a functional block diagram of a digital memory device in accordance with various embodiments of the present invention.

FIG. 2 illustrates a functional block diagram of digital memory device 201 in accordance with various embodiments of the present invention. Digital memory device 201 is depicted as a stand-alone integrated circuit, but one of ordinary skill in the art will recognize that embodiments of the present invention are not limited to stand-alone memory devices. Other digital memory devices compatible with embodiments may be, for example, embedded memory and cache memory including L1, L2 and L3 cache. Memory Device 201 may be DRAM. Access circuitry 203 and Precharge circuitry 205 may be logically separate and share independent circuit connections to memory banks 209, 211, and 213. Embodiments of the present invention may be practiced with any number of memory banks, such as for example an even number of memory banks. Memory banks 209, 211, and 213 may each contain a plurality of dynamic random access memory (DRAM) cells arranged in arrays of N rows and M columns. Such arrays may be partitioned into multiple subarrays. Memory banks 209, 211, and 213 may include Sense Amplifier circuits 217, 219, and 221, respectively, which may assist in driving and sensing voltages stored in the memory cells of the arrays of memory banks 209, 211, and 213 during a READ operation as well as driving new values into the memory cells during a WRITE operation. Memory banks 209, 211, and 213 may also include address decoders 223, 225, and 227. In embodiments, access circuitry 203 may include access global decoder 215. Access global decoder 215 and decoders 223, 225, and 227 may operate in conjunction to decode addresses received on pins of I/O (input/output) 207 during an access cycle of memory device 201. Access global decoder 215 may decode the most significant bits (MSB) of a received row or column address and may direct the remainder of the received address to the appropriate bank where one of bank-specific decoders 223, 225, and 227 may decode the least significant bits (LSB) of the received address before activating the appropriate row lines associated with the received address. In some embodiments, there may be no global decoder while in other embodiments there may be no bank-specific decoders.

Precharge circuitry 205 may have circuit(s) connecting it to memory banks 209, 211, and 213 independent from the circuit(s) connecting access circuitry 203 to memory banks 209, 211, and 213. Also, precharge circuitry 205 may include, in embodiments, precharge global decoder 229. Precharge circuitry 205 may be configured to receive via I/O 207 a next precharge address from a memory controller (not shown) or similar device. Precharge circuitry 205 may be configured to precharge one of banks 209, 211, or 213 associated with the received next precharge address (i.e. the bank containing the second subset of memory cells to be precharged). In embodiments, precharge circuitry 205 may be coupled to bank-specific precharge circuitry (not shown) that may be configured to precharge the bank, or a subset of the bank. In such embodiments, precharge circuitry 205 may be configured to merely direct such bank-specific precharge circuitry without performing any actual precharge operations itself.

Memory device 201 may, in embodiments, be a dual in-line memory module (DIMM). In such embodiments, memory device 201 may operate in conjunction with multiple DIMMs and a memory controller (not shown) may be configured to send independent precharge and access commands to each DIMM.

In embodiments, memory device 201 may be configured to accept commands on both a rising and falling edge of a clock cycle as taught by U.S. Pat. No. 7,254,690 titled "PIPE-LINED SEMICONDUCTOR MEMORIES AND SYSTEMS" issued Aug. 7, 2007. In such embodiments, addresses may be pipelined in order to decrease latency. With address pipelining, addresses may be accepted before a previous address has been completely routed to the bank and row it is intended for, speeding up access. This may be accomplished by inserting a Global Address Supervisor into memory device 201 to pipeline the addresses without causing conflicts. Thus, an access command with an associated address may be received on a rising edge of a clock cycle followed by a precharge command on the falling edge with another associated address. Memory device 201 may be configured to receive any combination of access and precharge commands on rising/falling edges of a clock cycle. For further details, see the patent document.

Figure 4:
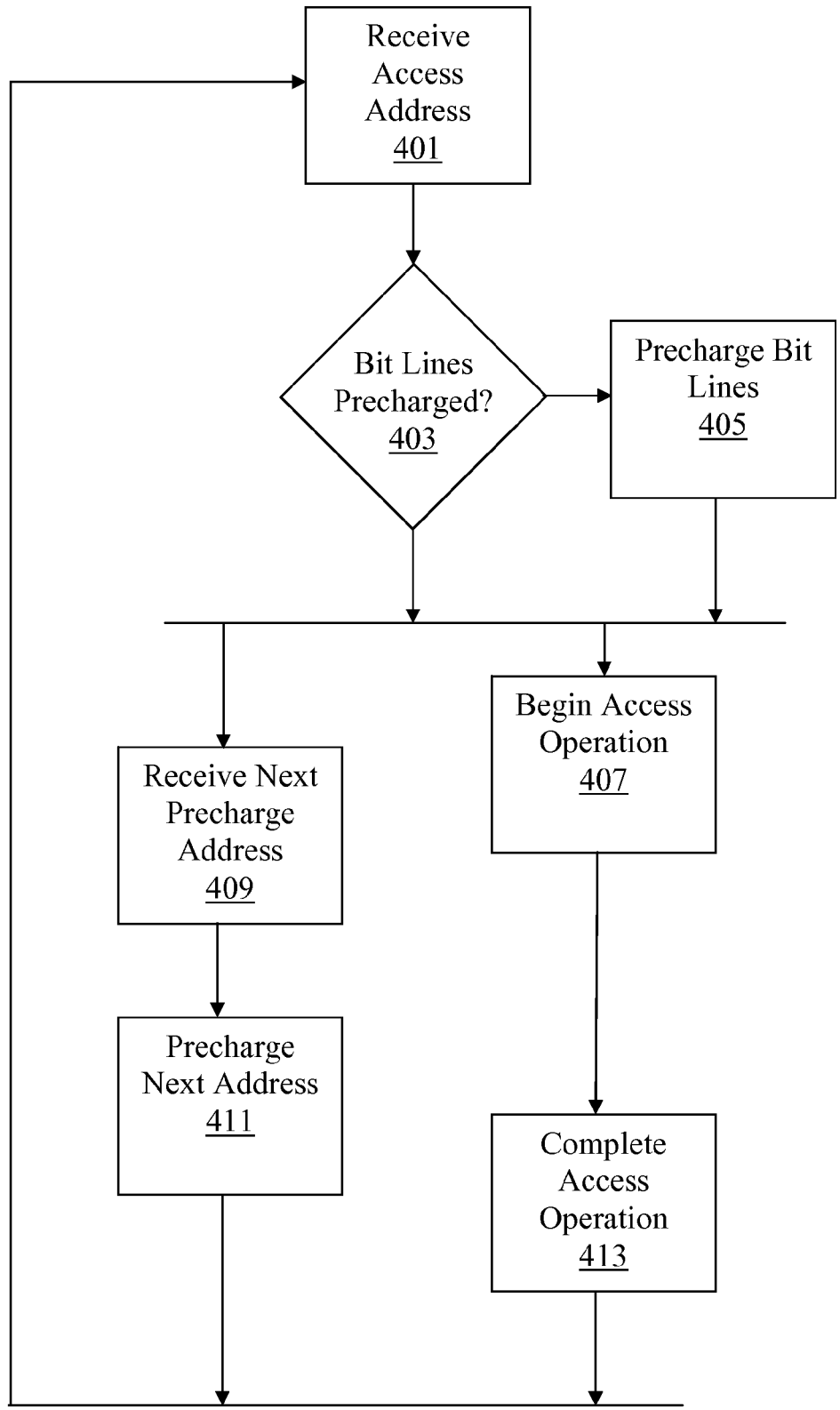
FIG. 4 depicts a flow chart of a method for independently accessing and precharging memory banks or cells in accordance with various embodiments.

FIG. 4 depicts a flow chart of a method for independently accessing and precharging memory banks or subset of bank memory cells in accordance with various embodiments, including embodiments depicted in FIG. 2. While the flow chart of FIG. 4 will be described in reference to digital memory device 201, other methods of operating digital memory device 201 are possible without departing from embodiments of the present invention and the method of operating digital memory depicted in FIG. 4 may be practiced on digital memory devices other than those represented by FIG. 2. As such, the digital memory device of FIG. 2 and the method of operation of FIG. 4 are not to be taken in a limiting sense with respect to the whole of disclosure of the present invention.

At the beginning of a current cycle of memory device 201, a memory controller (not shown) or similar device may place a command to access a first subset of memory cells as well as a current access address corresponding to the first subset onto a bus or busses (not shown) coupled to I/O 207. Access circuitry 203 may receive the command and associated first address 401. Digital memory device 201 may determine whether the first subset is currently precharged 403. If not, then precharge circuitry 205 may precharge one of bank 209, 211, or 213 or other bank associated with the received current access address at 405. In embodiments, precharge circuitry 205 may precharge all banks, or only a subset of one bank.

Once precharging is complete, or if the first subset has already been precharged, access circuitry 203 may pass along the partially decoded address to one of bank-specific decoder 223, 225, 227 or other bank-specific decoder which may then cause the first subset of memory cells associated with the received current access address to be activated. The bank-specific specific sense amplifier (217, 219, 221, or other sense amplifier) may begin to drive the bit lines and sense the stored voltages in the first subset of memory cells in a READ command or, if the access command is a WRITE command, write new bits to the first subset of memory cells at 407.

Because the decoding, activation, and sensing operations making up the current access cycle may take several clock cycles (for example seven to nine clock cycles or some other number of clock cycles), digital memory device 201 may receive, during the current access cycle, a next precharge address associated with a second subset of memory cells 409. Precharge circuitry 205 may then partially or wholly decode the received next precharge address and perform a precharge operation on the corresponding memory bank, or subset of the memory bank, containing the second subset of memory cells 411. In embodiments, if the first and second subsets are in the same memory bank, precharge circuitry 205 may selectively precharge, or cause to be selectively precharged, the second subset of memory cells using appropriate methods and devices. In alternative embodiments, precharge circuitry 205 may not precharge any bit lines during the current access cycle if the bank containing bit lines to be independently precharged is currently being accessed.

Finally, the current access operation may complete at 413 and the device may return to 401 to receive a new current access address beginning a new access cycle of digital memory device 201. If the previously-received next precharge address is the same as the new current access address, then the device may determines at 403 that bit lines associated with the subset of memory cells corresponding to the new access address are currently precharged. Such precharging may have been the result of the previous independent precharge at 411. Thus, digital memory device 201 may immediately commence the access operation on the subset of memory cells 407 associated with the new received access address without waiting for the device to precharge the bit lines associated with the subset at 405. Thus, digital memory device 201 and other digital memory devices embodied with the teachings of the present invention may utilize "hidden" cycles, by independently precharging one set of bit lines while accessing memory cells coupled to another set of bit lines thereby reducing latency and speeding access time to the device. Also, embodiments of the present invention may consume less power than prior art devices by precharging only a single bank, or subset of a single bank, rather than precharging all banks.

In embodiments, memory device 201 may be configured to precharge only at the end of a cycle, and not concurrently with a current access operation. Even though doing so may not reduce latency, it may be required if memory device 201 is used in a legacy system that only allows precharge at the end of the cycle. Thus, the operation of memory device 201 may emulate traditional DRAM if necessary.

In other embodiments, the next precharge address may be based on a predictive method. In embodiments, the next access address may be based using a history or access or past accesses of digital memory device 201. In other embodiments, the next access address may be based on spatial or temporal prefetches as taught by U.S. Pat. No. 5,835,932 "METHODS AND SYSTEMS FOR MAINTAINING DATA LOCALITY IN A MULTIPLE MEMORY BANK SYSTEM HAVING DRAM WITH INTEGRAL SRAM" issued Nov. 10, 1998. In particular, by storing spatially and/or temporally adjacent data within multiple banks, the probability may be increased that sequentially requested data may be found in adjacent banks and thus retrieval of that data may be able to take advantage of the independent precharge and access circuits. For further details, see the patent document. In embodiments, the next precharge address may be based on a known address and not on a predicted next address.

In embodiments, an array, subarray, or other subset of memory cells within bank 209, 211, 213, or other bank may be selectively precharged at either 405 or 411. Methods, apparatuses, and systems for such selective precharging is disclosed in U.S. patent application Ser. No. 11/771,895 titled "MEMORIES WITH SELECTIVE PRECHARGE" filed Jun. 29, 2007 and U.S. patent application Ser. No. 11/771,853 titled "MEMORIES WITH FRONT END PRECHARGE" filed Jun. 29, 2007. As described therein, memory devices may include precharge select circuitry to selectively precharge, either on the front or back end of an access cycle of a device, a subset of bit lines fewer than all bit lines in a memory device, or all bit lines in a single memory bank of a memory device. In some embodiments described therein, such selective precharging may be of the particular bit lines to be accessed. Selectively precharging may reduce power consumption and decrease access time. For further details, see the patent applications.

Figure 3:
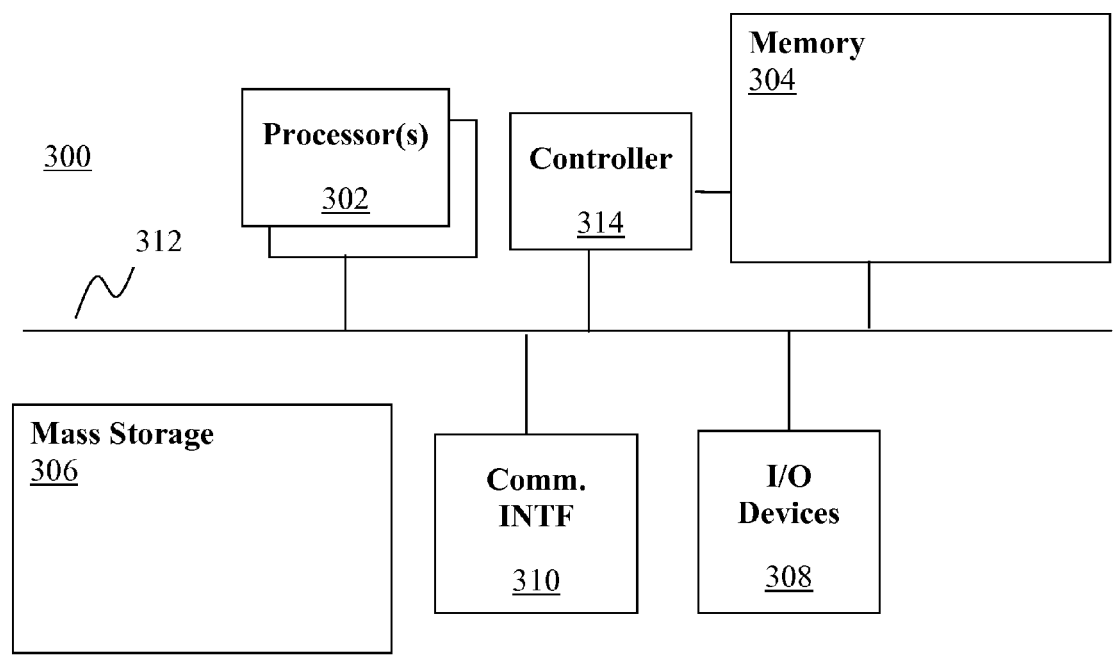
FIG. 3 illustrates an example computing system suitable for use to practice the invention, in accordance with various embodiments.

FIG. 3 illustrates an example computing system/device suitable for use to practice various digital memory devices incorporating embodiments of the present invention. As shown, computing system/device 300 may include one or more processors 302, and system memory 304, such as for example digital memory device 201 of FIG. 2. Additionally, computing system/device 300 may include mass storage devices 306 (such as diskette, hard drive, CDROM and so forth), input/output devices 308 (such as keyboard, cursor control and so forth) and communication interfaces 310 (such as network interface cards, modems and so forth). The elements may be coupled to each other via system bus 312, which represents one or more buses. In the case of multiple buses, they may be bridged by one or more bus bridges (not shown). Finally, controller 314 embodied with some or all of the teachings of the present invention may be provided and configured to operate memory 304. In embodiments, controller 314 may be configured to issue READ and WRITE access commands to memory 304 and also to issue precharge commands to memory 304 in accordance with various embodiments of the present invention. In embodiments, controller 314 may be configured to issue a next precharge address based on a predicted next access address. In embodiments, controller 314 may be configured to issue a next precharge address to memory 304 using past accesses or a history of accesses. In embodiments controller 304 may be configured to issue a next precharge address based on a special or temporal prefetches. In embodiments, memory controller 314 may base the next precharge address on a known address of the next actual access command and not on a predicted next address. In alternative embodiments, memory 304 may include a controller (not shown) to perform some or all of the functions of controller 314. In embodiments, some or all of the functions of controller 314 could be effectively implemented within memory 304. In embodiments, such functions may be performed by use of a mode register within memory 304. Just as an example, in embodiments a mode may be set using the mode register such that precharge occurs at the beginning or set such that precharge occurs at the end of a cycle.

Other than the teachings of the various embodiments of the present invention, each of the elements of computer system/device 300 may perform its conventional functions known in the art. In particular, system memory 304 and mass storage 306 may be employed to store a working copy and a permanent copy of programming instructions implementing one or more software applications.

Although FIG. 3 depicts a computer system, one of ordinary skill in the art will recognize that embodiments of the present invention may be practiced using other devices that utilize DRAM or other types of digital memory such as, but not limited to, mobile telephones, Personal Data Assistants (PDAs), gaming devices, high-definition television (HDTV) devices, appliances, networking devices, digital music players, laptop computers, portable electronic devices, telephones, as well as other devices known in the art.

In various embodiments, the earlier described memory cells are embodied in an integrated circuit. The integrated circuit may be described using any one of a number of hardware design language, such as but not limited to VHDL or Verilog. The compiled design may be stored in any one of a number of data format, such as but not limited to GDS or GDS II. The source and/or compiled design may be stored on any one of a number of medium such as but not limited to DVD.

Although specific embodiments have been illustrated and described herein for purposes of description of the preferred embodiment, it will be appreciated by those of ordinary skill in the art that a wide variety of alternate and/or equivalent implementations may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein.

What is claimed is:

1. An apparatus, comprising:
a memory bank;
a memory controller configured to determine a next precharge address based, at least in part, on past accesses of the memory bank;
access circuitry coupled to the memory bank via a first set of circuit connections, wherein the access circuitry is configured to access, during an access cycle, a first subset of memory cells in the memory bank; and
precharge circuitry coupled to the memory bank via a second set of circuit connections, wherein the precharge circuitry is configured to precharge, during the access cycle, a second subset of memory cells in the memory bank, and wherein the next precharge address identifies the second subset of memory cells.

2. The apparatus of claim 1, wherein the precharge circuitry is further configured to precharge the second subset of memory cells upon receipt of the next precharge address from the memory controller.

3. The apparatus of claim 1, wherein the memory bank forms a dual in-line memory module (DIMM).

4. An article of manufacture, comprising a plurality of computer-readable hardware design language instructions, or compilation of the hardware design language instructions, wherein the hardware design language instructions specify an implementation of the apparatus as set forth in claim 1 as an integrated circuit.

5. An apparatus, comprising:
a memory bank;
a memory controller configured to determine a next precharge address based on spatial or temporal prefetches;
access circuitry coupled to the memory bank via a first set of circuit connections, wherein the access circuitry is configured to access, during an access cycle, a first subset of memory cells in the memory bank; and
precharge circuitry coupled to the memory bank via a second set of circuit connections, wherein the precharge circuitry is configured to precharge, during the access cycle, a second subset of memory cells in the memory bank, and wherein the next precharge address identifies the second subset of memory cells.

6. The apparatus of claim 5, wherein the memory bank forms a dual in-line memory module (DIMM).

7. The apparatus of claim 5, wherein the precharge circuitry is further configured to precharge the second subset of memory cells upon receipt of the next precharge address from the memory controller.

8. A method of operating digital memory, the method comprising:
accessing, by access circuitry of the digital memory during an access cycle, a first subset of memory cells in a memory bank of the digital memory, wherein the first subset is associated with a current access address;
determining, by a memory controller, a next precharge address based, at least in part, on past accesses of the memory bank; and
precharging, during the access cycle, by precharge circuitry disposed in parallel relative to the access circuitry, a second subset of memory cells in the memory bank of the digital memory, wherein the second subset is associated with the next precharge address.

9. The method of claim 8, further comprising receiving, by the precharge circuitry from the memory controller, the next precharge address, wherein said precharging is in response to said receiving.

10. The method of claim 9, wherein the memory bank forms a dual in-line memory module (DIMM).

11. The method of claim 9, wherein the memory bank forms a dual in-line memory module (DIMM).

12. A method of operating digital memory, the method comprising:
accessing, by access circuitry of the digital memory during an access cycle, a first subset of memory cells in a memory bank of the digital memory, wherein the first subset is associated with a current access address;
determining, by a memory controller, a next precharge address based on spatial or temporal prefetches; and
precharging, during the access cycle, by precharge circuitry disposed in parallel relative to the access circuitry, a second subset of memory cells in the memory bank of the digital memory, wherein the second subset is associated with the next precharge address.

13. The method of claim 12, further comprising receiving, by the precharge circuitry from the memory controller, the next precharge address, wherein said precharging is in response to said receiving.

14. A system, comprising:
a digital memory unit including:
a plurality of memory banks;
access circuitry coupled to the plurality of memory banks and configured to receive a current access address and to access a first subset of memory cells in one of the plurality of memory banks, wherein the first subset of memory cells is associated with the current access address; and
precharge circuitry independently coupled to the plurality of memory banks and configured to receive a next precharge address and to precharge a second subset of memory cells in the one of the plurality of memory banks, wherein the second subset of memory cells is associated with the next precharge address; and a memory controller coupled to the digital memory unit via a data bus, wherein the memory controller is configured to read and write data from the digital memory unit via the data bus, and wherein the memory controller is further configured to determine the next precharge address based, at least in part, on one or more past accesses of the memory banks.

15. The system of claim 14, wherein the memory controller is further configured to determine the next precharge address based on spatial or temporal prefetches.

16. The system of claim 14, wherein the plurality of memory banks forms a dual in-line memory module (DIMM).

17. An apparatus, comprising:
access circuitry configured to access, during an access cycle, a first subset of memory cells associated with a current access address, wherein the first subset of memory cells are in a bank of memory cells; and
precharge circuitry configured to precharge a second subset of memory cells associated with a next precharge address during the access cycle, wherein the second subset of memory cells are in the bank of memory cells, and wherein the precharge circuitry is further configured to determine the next precharge address based on spatial or temporal prefetches.

18. The apparatus of claim 17, wherein the precharge circuitry is further configured to determine the next precharge address based, at least in part, on past accesses of the memory bank.

19. An apparatus, comprising:
input/output (I/O) pins configured to couple the apparatus to a bus line;
logic configured to send, to a digital memory device via the bus line:
a current access command and an associated current access address corresponding to a first subset of memory cells; and
a next precharge address corresponding to a second subset of memory cells, different from the first subset of memory cells, to be precharged during an access cycle that the first subset of memory cells are accessed, wherein the second subset of memory cells is in a memory bank that has more memory cells than the second subset of memory cells, and wherein the precharge circuitry is further configured to determine the next precharge address based on spatial or temporal prefetches, or based, at least in part, on past accesses of the memory bank.

20. The apparatus of claim 19, further comprising logic configured to determine the next precharge address based, at least in part, on either past accesses of the digital memory device, spatial prefetches, or temporal prefetches.

* * * * *